United States Patent
Yamada et al.

(10) Patent No.: US 12,221,543 B2
(45) Date of Patent: Feb. 11, 2025

(54) THERMALLY CONDUCTIVE SILICONE COMPOSITION AND PRODUCTION METHOD THEREFOR

(71) Applicant: SHIN-ETSU CHEMICAL CO., LTD., Tokyo (JP)

(72) Inventors: Kunihiro Yamada, Annaka (JP); Kenichi Tsuji, Annaka (JP); Keita Kitazawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 539 days.

(21) Appl. No.: 17/771,086

(22) PCT Filed: Oct. 1, 2020

(86) PCT No.: PCT/JP2020/037438
§ 371 (c)(1),
(2) Date: Apr. 22, 2022

(87) PCT Pub. No.: WO2021/079714
PCT Pub. Date: Apr. 29, 2021

(65) Prior Publication Data
US 2022/0380548 A1 Dec. 1, 2022

(30) Foreign Application Priority Data
Oct. 24, 2019 (JP) ................. 2019-193234

(51) Int. Cl.
| | |
|---|---|
| C08L 83/04 | (2006.01) |
| C08G 77/12 | (2006.01) |
| C08G 77/20 | (2006.01) |
| C08K 3/08 | (2006.01) |
| C08K 3/22 | (2006.01) |
| C08K 5/01 | (2006.01) |

(52) U.S. Cl.
CPC .............. *C08L 83/04* (2013.01); *C08G 77/12* (2013.01); *C08G 77/20* (2013.01); *C08K 3/08* (2013.01); *C08K 3/22* (2013.01); *C08K 5/01* (2013.01); *C08K 2003/0812* (2013.01); *C08K 2003/2296* (2013.01); *C08K 2201/001* (2013.01); *C08K 2201/003* (2013.01); *C08K 2201/005* (2013.01); *C08K 2201/014* (2013.01)

(58) Field of Classification Search
None
See application file for complete search history.

(56) References Cited

U.S. PATENT DOCUMENTS

| | | | |
|---|---|---|---|
| 5,227,081 A | 7/1993 | Sawa et al. | |
| 6,255,257 B1 | 7/2001 | Yamada et al. | |
| 11,773,977 B2 * | 10/2023 | George | F16J 15/0887 |
| | | | 277/626 |
| 2002/0018885 A1 | 2/2002 | Takahashi et al. | |
| 2003/0049466 A1 * | 3/2003 | Yamada | C08L 83/04 |
| | | | 528/10 |
| 2003/0195124 A1 | 10/2003 | Yamada et al. | |
| 2008/0057325 A1 | 3/2008 | Sakurai et al. | |
| 2010/0130673 A1 | 5/2010 | Ito et al. | |
| 2017/0349801 A1 * | 12/2017 | Wu | C08L 83/04 |
| 2018/0022977 A1 | 1/2018 | Tsuji | |
| 2020/0347315 A1 | 11/2020 | Iwata | |
| 2021/0147881 A1 | 5/2021 | Hirakawa et al. | |
| 2023/0323181 A1 * | 10/2023 | Namiki | C09K 5/14 |
| | | | 252/78.3 |

FOREIGN PATENT DOCUMENTS

| | | |
|---|---|---|
| CN | 107406678 A | 11/2017 |
| EP | 0 896 031 A2 | 2/1999 |
| EP | 1 375 623 A1 | 1/2004 |
| JP | 2000-169873 A | 6/2000 |
| JP | 3195277 B2 | 8/2001 |
| JP | 2002-327116 A | 11/2002 |
| JP | 2004-210856 A | 7/2004 |
| JP | 3541390 B2 | 7/2004 |
| JP | 2005-162975 A | 6/2005 |
| JP | 2006-143978 A | 6/2006 |
| JP | 3948642 B2 | 7/2007 |

(Continued)

OTHER PUBLICATIONS

Machine translation of JP 2010-006923 (no date).*

(Continued)

*Primary Examiner* — Marc S Zimmer
(74) *Attorney, Agent, or Firm* — Birch, Stewart, Kolasch & Birch, LLP

(57) ABSTRACT

A thermally conductive silicone composition that has high thermal conductivity and excellent workability and misalignment resistance, and contains, in specific ratios:

a silicone gel cross-linked product (A);

a silicone oil (B) not containing either aliphatic unsaturated bonds or SiH groups and being used as a surface treatment agent for components (C) and (D);

an aluminum powder (C) including (C-1)-(C-3), (C-1) being an aluminum powder having an average particle diameter of 40-100 μm, (C-2) being an aluminum powder having an average particle diameter of at least 6 μm and less than 40 μm, and (C-3) being an aluminum powder having an average particle diameter of at least 0.4 μm and less than 6 μm;

a zinc oxide powder (D) having an average particle diameter of 0.1-10 μm; and a volatile solvent (E).

6 Claims, No Drawings

(56) References Cited

FOREIGN PATENT DOCUMENTS

| | | | |
|---|---|---|---|
| JP | 2008-56761 A | 3/2008 | |
| JP | 4130091 B2 | 8/2008 | |
| JP | 2010006923 A * | 1/2010 | |
| JP | 4796704 B2 | 10/2011 | |
| JP | 5300408 B2 | 9/2013 | |
| JP | 5388329 B2 | 1/2014 | |
| JP | 2014-37460 A | 2/2014 | |
| JP | 2016-84378 A | 5/2016 | |
| JP | 2017-43717 A | 3/2017 | |
| WO | WO-2007086443 A1 * | 8/2007 | .............. C08L 83/04 |
| WO | WO 2018/016566 A1 | 1/2018 | |
| WO | WO 2018/131486 A1 | 7/2018 | |
| WO | WO 2019/093052 A1 | 5/2019 | |

OTHER PUBLICATIONS

Chinese Office Action and Search Report for Chinese Application No. 202080074195.8, dated Mar. 4, 2023.
International Search Report (PCT/ISA/210) issued in PCT/JP2020/037438 mailed on Dec. 15, 2020.
Written Opinion (PCT/ISA/237) issued in PCT/JP2020/037438 mailed on Dec. 15, 2020.

* cited by examiner

THERMALLY CONDUCTIVE SILICONE COMPOSITION AND PRODUCTION METHOD THEREFOR

TECHNICAL FIELD

This invention relates to a heat conductive silicone composition having a high thermal conductivity and improved slide resistance and a method for preparing the same.

BACKGROUND ART

Since electric and electronic devices typically generate heat during service, heat removal is necessary in order that the devices operate properly. Various heat conductive materials are proposed for the heat removal purpose. The heat conductive materials are generally divided into two types, (1) sheet-like materials which are easy to handle and (2) paste-like materials.

The sheet-like materials have the advantages of ease of handling and stability, but their heat dissipation ability is inferior to the paste-like materials because of essentially increased contact thermal resistance. Also, since the materials should have sufficient levels of strength and hardness to maintain the sheet shape, they fail to accommodate the tolerance between electric or electronic devices and heat dissipating members, with the risk that the devices can be broken by stresses.

On the other hand, the paste-like materials are compatible with the mass-scale manufacture when applicators or the like are used, and have the advantage of a satisfactory heat dissipation ability due to low contact thermal resistance. In the case of mass-scale manufacture by screen printing or the like, the paste should preferably have a lower viscosity. However, the paste having a low viscosity can be slid or shifted by thermal cycling impacts of devices, known as pump-out phenomenon. This results in insufficient heat removal, which can cause the devices to malfunction. While the following silicone compositions are proposed in the prior art, there is the demand for a heat conductive silicone composition having better performance and improved slide resistance.

PRIOR ART DOCUMENTS

Patent Documents

Patent Document 1: JP 3948642
Patent Document 2: JP 3195277
Patent Document 3: JP-A 2000-169873
Patent Document 4: JP-A 2006-143978
Patent Document 5: JP-A 2004-210856
Patent Document 6: JP-A 2005-162975
Patent Document 7: JP 5300408
Patent Document 8: JP 4796704
Patent Document 9: JP 3541390
Patent Document 10: JP 4130091
Patent Document 11: JP 5388329

SUMMARY OF INVENTION

Technical Problem

An object of the invention, which has been made under the above-mentioned circumstances, is to provide a heat conductive silicone composition having a high thermal conductivity, ease of working, and improved slide resistance, and a method for preparing the same.

Solution to Problem

Making extensive investigations to attain the above object, the inventors have found that a heat conductive silicone composition comprising a crosslinked silicone gel, a specific silicone oil, especially one end hydrolyzable organopolysiloxane, an aluminum powder, especially a specific mixture of aluminum powders, a zinc oxide powder, and a volatile solvent, especially isoparaffin base solvent having a boiling point of 80-360° C. has a high thermal conductivity and meets both ease of working and pump-out resistance. The invention is predicated on this finding.

Accordingly, the invention provides a heat conductive silicone composition and a method for preparing the same, as defined below.

[1]

A heat conductive silicone composition comprising
(A) a crosslinked silicone gel,
(B) a silicone oil containing neither aliphatic unsaturated bonds nor SiH groups and serving as a surface treatment agent for components (C) and (D),
(C) an aluminum powder in an amount of 800 to 2,000 parts by weight per 100 parts by weight of components (A) and (B) combined, the aluminum powder including
(C-1) an aluminum powder having an average particle size of from 40 µm to 100 µm in an amount of 30 to 70% by weight of component (C).
(C-2) an aluminum powder having an average particle size of from 6 µm to less than 40 µm in an amount of 10 to 60% by weight of component (C), and
(C-3) an aluminum powder having an average particle size of from 0.4 µm to less than 6 µm in an amount of 10 to 60% by weight of component (C).
(D) a zinc oxide powder having an average particle size of 0.1 to 10 µm in an amount of 50 to 500 parts by weight per 100 parts by weight of components (A) and (B) combined, and
(E) a volatile solvent in an amount of 10 to 300 parts by weight per 100 parts by weight of components (A) and (B) combined.

[2]

The heat conductive silicone composition of [1] wherein component (B) contains (B-1) a silicone oil in the form of a one end hydrolyzable organopolysiloxane having the general formula (1):

[Chem. 1]

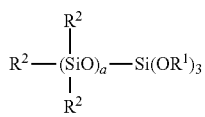

(1)

wherein $R^1$ is each independently a $C_1$-$C_6$, alkyl group, $R^2$ is at least one group selected from $C_1$-$C_{18}$ aliphatic unsaturation-free, unsubstituted or substituted monovalent hydrocarbon groups, and a is an integer of 5 to 120, and component (B) is blended in an amount of 10 to 90% by weight based on the total weight of components (A) and (B).

[3]

The heat conductive silicone composition of [1] or [2] wherein component (A) contains a crosslinked silicone gel composed of (F) an organopolysiloxane containing at least one silicon-bonded alkenyl group per molecule, represented by the average compositional formula (2):

$$R^3{}_b R^4{}_c SiO_{(4-b-c)/2} \qquad (2)$$

wherein $R^3$ is an alkenyl group, $R^4$ is an aliphatic unsaturation-free, unsubstituted or substituted monovalent hydrocarbon group, b is a number of 0.0001 to 0.2, c is a number of 1.7 to 2.2, and b+c is a number of 1.9 to 2.4, and (G) an organohydrogenpolysiloxane containing at least 4 silicon-bonded hydrogen atoms at non-terminal positions of the molecular chain per molecule, and meeting the formula (3):

$$0.1 < \alpha/\beta \qquad (3)$$

wherein α is the number of silicon-bonded hydrogen atoms at non-terminal positions of the molecular chain and β is the total number of silicon atoms in component (G).

[4]

The heat conductive silicone composition of any one of [1] to [3] wherein component (B) further contains (B-2) a non-functional liquid silicone oil having a kinematic viscosity of 10 to 500,000 mm²/s at 25° C., in an amount of 10 to 70% by weight of component (B).

[5]

The heat conductive silicone composition of any one of [1] to [4] wherein component (E) is an isoparaffin base solvent having a boiling point of 80 to 360° C.

[6]

A method of preparing a heat conductive silicone composition comprising the step of mixing the following:

(A) a crosslinked silicone gel, (B) a silicone oil containing neither aliphatic unsaturated bonds nor SiH groups and serving as a surface treatment agent for components (C) and (D), (C) an aluminum powder in an amount of 800 to 2,000 parts by weight per 100 parts by weight of components (A) and (B) combined, the aluminum powder including (C-1) an aluminum powder having an average particle size of from 40 μm to 100 μm in an amount of 30 to 70% by weight of component (C), (C-2) an aluminum powder having an average particle size of from 6 μm to less than 40 μm in an amount of 10 to 60% by weight of component (C), and (C-3) an aluminum powder having an average particle size of from 0.4 μm to less than 6 μm in an amount of 10 to 60% by weight of component (C), (D) a zinc oxide powder having an average particle size of 0.1 to 10 μm in an amount of 50 to 500 parts by weight per 100 parts by weight of components (A) and (B) combined, and (E) a volatile solvent in an amount of 10 to 300 parts by weight per 100 parts by weight of components (A) and (B) combined.

Advantageous Effects of Invention

The heat conductive silicone composition of the invention has a high thermal conductivity and attains remarkable improvements in ease of working and pump-out resistance.

DESCRIPTION OF EMBODIMENTS

Now the invention is described in detail.

[Component (A)]

Component (A) is a crosslinked silicone gel which serves as a matrix of the heat conductive silicone composition. Component (A) is preferably a product obtained from hydrosilylation reaction or addition reaction of component (F) with component (G) in the presence of component (H), as shown below, (F) an organopolysiloxane containing at least one silicon-bonded alkenyl group per molecule, represented by the average compositional formula (2):

$$R^3{}_b R^4{}_c SiO_{(4-b-c)/2} \qquad (2)$$

wherein $R^3$ is an alkenyl group, $R^4$ is an aliphatic unsaturation-free, unsubstituted or substituted monovalent hydrocarbon group, b is a number of 0.0001 to 0.2, c is a number of 1.7 to 2.2, and b+c is a number of 1.9 to 2.4, (G) an organohydrogenpolysiloxane containing at least 4 silicon-bonded hydrogen atoms at non-terminal positions of the molecular chain per molecule, and meeting the formula (3):

$$0.1 < \alpha/\beta \qquad (3)$$

wherein α is the number of silicon-bonded hydrogen atoms at non-terminal positions of the molecular chain and β is the total number of silicon atoms in component (G), and (H) a platinum base catalyst.

[Component (F)]

Component (F) is a base of component (A). Component (F) is an organopolysiloxane containing at least one silicon-bonded alkenyl group (or alkenyl group bonded to a silicon atom) per molecule, represented by the above average compositional formula (2). The organopolysiloxane contains preferably at least 2 alkenyl groups, more preferably 2 to 50 alkenyl groups, most preferably 2 to 20 alkenyl groups per molecule. The alkenyl groups may be bonded to silicon atoms at ends of the molecular chain, or silicon atoms at non-terminal positions of the molecular chain (i.e., other than both ends of the molecular chain), or combinations thereof.

In formula (2), $R^3$ is an alkenyl group of typically 2 to 6 carbon atoms, preferably 2 to 4 carbon atoms. Examples thereof include lower alkenyl groups such as vinyl, allyl, propenyl, isopropenyl, butenyl and isobutenyl, with vinyl being preferred.

$R^4$ is an aliphatic unsaturation-free, unsubstituted or substituted monovalent hydrocarbon group of typically 1 to 10 carbon atoms, preferably 1 to 6 carbon atoms. Examples thereof include alkyl groups such as methyl, ethyl, propyl, isopropyl, butyl, isobutyl, tert-butyl, pentyl, hexyl, cyclohexyl, octyl and decyl; aryl groups such as phenyl and tolyl; aralkyl groups such as benzyl and phenylethyl; and the foregoing groups in which some or all of the hydrogen atoms are substituted by halogen atoms. e.g., fluorine and chlorine, such as chloromethyl and 3,3,3-trifluoropropyl. For ease of synthesis, methyl, phenyl and 3,3,3-trifluoropropyl are preferred.

In formula (2), the values of b, c and b+c are as defined above, b is preferably a number of 0.0005 to 0.1, c is preferably a number of 1.9 to 2.0, and b+c is preferably a number of 1.95 to 2.05.

The molecular structure of the organopolysiloxane as component (F) is not particularly limited. It may have a linear structure, branched structure containing $R^3SiO_{3/2}$ units, $R^4SiO_{3/2}$ units, $SiO_2$ units or the like as part of the molecular chain wherein $R^3$ and $R^4$ are as defined above, cyclic structure, or three-dimensional network or resinous structure. Typically, it is a linear diorganopolysiloxane which has a backbone composed mainly of repeating diorganosiloxane units and is capped with triorganosiloxy groups at both ends of the molecular chain.

The organopolysiloxane as component (F) preferably has a kinematic viscosity at 25° C. of 50 to 100.000 mm²/s, more preferably 100 to 10,000 mm²/s. As long as the kinematic viscosity is 50 to 100,000 mm²/s, the cured product has better fluidity and workability. As used herein, the kinematic viscosity is measured at 25° C. by an Ostwald viscometer (the same holds true, hereinafter).

Examples of the organopolysiloxane as component (F) include those having the general formula (4):

[Chem. 2]

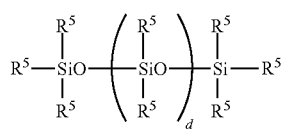
(4)

wherein $R^5$ is each independently an unsubstituted or substituted monovalent hydrocarbon group, at least one, preferably at least two of $R^5$ being alkenyl groups, and d is an integer of 20 to 2,000.

In formula (4), the unsubstituted or substituted monovalent hydrocarbon group represented by $R^5$ is the same as defined for $R^3$ (alkenyl group) and $R^4$ (aliphatic unsaturation-free unsubstituted or substituted monovalent hydrocarbon group), with the carbon count and illustrative examples being also the same. The subscript d is preferably an integer of 40 to 1,200, more preferably 50 to 600.

Illustrative examples of the organopolysiloxane having formula (4) include molecular chain both end dimethylvinylsiloxy-capped dimethylpolysiloxane, molecular chain one end trimethylsiloxy-capped, one end dimethylvinylsiloxy-capped dimethylpolysiloxane, molecular chain both end trimethylsiloxy-capped dimethylsiloxane/methylvinylsiloxane copolymers, molecular chain one end trimethylsiloxy-capped, one end dimethylvinylsiloxy-capped dimethylsiloxane/methylvinylsiloxane copolymers, molecular chain both end dimethylvinylsiloxy-capped dimethylsiloxane/methylvinyisiloxane copolymers, and molecular chain both end dimethylvinylsiloxy-capped dimethylsiloxane/diphenylsiloxane copolymers.

The organopolysiloxane as component (F) may be used alone or in admixture of two or more.

[Component (G)]

Component (G) serves as a crosslinker by reacting with component (F). Component (G) is an organohydrogenpolysiloxane containing at least 4 silicon-bonded hydrogen atoms at non-terminal positions of the molecular chain per molecule and meeting the formula (3):

$$0.1 < \alpha/\beta \tag{3}$$

wherein α is the number of silicon-bonded hydrogen atoms at non-terminal positions of the molecular chain and β is the total number of silicon atoms in component (G). The number of silicon-bonded hydrogen atoms (or hydrogen atoms bonded to silicon atoms, i.e., SiH groups) at non-terminal positions of the molecular chain per molecule is at least 4 for the reason that no sufficient slide resistance is exerted if the number of silicon-bonded hydrogen atoms is 3 or less.

The requirement, $0.1 < \alpha/\beta$ should be fulfilled at the same time for the reason that the composition is degraded in slide resistance if the value of a/P is equal to or less than 0.1. The value of α/β is preferably at least 0.11, more preferably at least 0.12. Although the upper limit is not critical, the value of α/β is preferably up to 0.95, more preferably up to 0.90.

The molecular structure of component (G) is not particularly limited as long as the above requirements are fulfilled, and may be, for example, linear, cyclic, branched, or three-dimensional network (or resinous). Those organohydrogenpolysiloxanes in which the number of silicon atoms per molecule (or degree of polymerization) is typically 3 to 1,000, preferably 5 to 400, more preferably 10 to 300, even more preferably 10 to 100, most preferably 10 to 60 are desirable from the aspects of ease of handling and slide resistance of a cured product obtained from crosslinking of component (F).

The organohydrogenpolysiloxane as component (G) has a kinematic viscosity of typically 1 to 10,000 mm²/s, preferably 3 to 5.000 mm²/s, more preferably 5 to 3,000 mm²/s, and is desirably liquid at room temperature (25° C.).

Preferred examples of the organohydrogenpolysiloxane as component (G) include those having the average compositional formula (5).

$$R^6_e H_f SiO_{(4-e-f)/2} \tag{5}$$

wherein $R^6$ is an aliphatic unsaturation-free, unsubstituted or substituted monovalent hydrocarbon group, e is a number of 0.7 to 2.2, f is a number of 0.001 to 0.5, and e+f is a number of 0.8 to 2.5.

In formula (5), $R^6$ is an aliphatic unsaturation-free, unsubstituted or substituted monovalent hydrocarbon group of typically 1 to 10 carbon atoms, preferably 1 to 6 carbon atoms. Examples thereof include alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; and the foregoing groups in which some or all of the hydrogen atoms are substituted by halogen atoms, e.g., fluorine and chlorine, such as 3,3,3-trifluoropropyl. Of these, alkyl, aryl and 3,3,3-trifluoropropyl groups are preferred, with methyl, phenyl and 3,3,3-trifluoropropyl being more preferred.

In formula (5), the values of e, f and e+f are as defined above, e is preferably a number of 0.9 to 2.1, f is preferably a number of 0.002 to 0.2, especially 0.005 to 0.1, and e+f is preferably a number of 1.0 to 2.3, especially 1.5 to 2.2.

The molecular structure of the organohydrogenpolysiloxane having formula (5) is not particularly limited, and may be linear, cyclic, branched, or three-dimensional network (or resinous). Those compounds having a silicon count per molecule and a kinematic viscosity in the above ranges and especially of linear structure are preferred.

Examples of the organohydrogenpolysiloxane having formula (5) include molecular chain both end trimethylsiloxy-capped dimethylsiloxane/methylhydrogensiloxane copolymers, molecular chain both end trimethylsiloxy-capped methylhydrogenpolysiloxane, molecular chain both end dimethylhydrogensiloxy-capped dimethylsiloxane/methylhydrogensiloxane copolymers, molecular chain both end dimethylhydrogensiloxy-capped methylhydrogensiloxane/dimethylsiloxane/diphenylsiloxane copolymers, molecular chain one end dimethylhydrogensiloxy-capped, one end trimethylsiloxy-capped dimethylsiloxane/methylhydrogensiloxane copolymers, molecular chain one end dimethylhydrogensiloxy-capped, one end trimethylsiloxy-capped methylhydrogensiloxane/dimethylsiloxane/diphenylsiloxane copolymers, copolymers consisting of $(CH_3)_2HSiO_{1/2}$ units, $(CH_3)_3SiO_{1/2}$ units, $(CH_3)HSiO_{2/2}$ units, and $SiO_{4/2}$ units, copolymers consisting of $(CH_3)_2HSiO_{1/2}$ units, $(CH_3)_3SiO_{1/2}$ units, $(CH_3)HSiO_{2/2}$ units, $(CH_3)_2SiO_{2/2}$ units, and $SiO_{4/2}$ units, copolymers consisting of $(CH_3)_2HSiO_{1/2}$ units, $(CH_3)HSiO_{2/2}$ units, $(CH_3)_2SiO_{2/2}$ units, and $SiO_{4/2}$ units, copolymers consisting of $(CH_3)_2HSiO_{1/2}$ units, $SiO_{4/2}$ units, $(CH_3)HSiO_{2/2}$ units, $(CH_3)_2SiO_{2/2}$ units, and $(C_6H_5)_3SiO_{1/2}$ units, and copolymers consisting of $(CH_3)_2HSiO_{1/2}$ units, $(CH_3)_3SiO_{1/2}$ units, $(C_6H_5)_2SiO_{2/2}$ units, $(CH_3)HSiO_{2/2}$ units, $(CH_3)_2SiO_{2/2}$ units, and $SiO_{4/2}$ units.

Component (G) is blended in such an amount that the number of silicon-bonded hydrogen atoms in component (G) is 0.3 to 2.0, preferably 0.4 to 1.5, more preferably 0.5 to 1.0 per silicon-bonded alkenyl group in component (F). If the number of silicon-bonded hydrogen atoms is less than 0.3, the crosslinking density becomes too low and the resulting heat conductive silicone composition is degraded in slide resistance. If the number is more than 2.0, the resulting heat conductive silicone composition has too high a viscosity and is awkward to handle.

The organohydrogenpolysiloxane as component (G) may be used alone or in admixture of two or more.

[Component (H): Platinum Base Catalyst]

Component (H) is to promote addition reaction of silicon-bonded alkenyl groups in component (F) with silicon-bonded hydrogen atoms in component (G). Component (H) is a platinum base catalyst, specifically platinum and/or platinum base compound.

Any well-known compounds may be used as the platinum and platinum base compound. Examples include platinum black, chloroplatinic acid, alcohol-modified chloroplatinic acids, and complexes of chloroplatinic acid with olefins, aldehydes, vinylsiloxanes, and acetylene alcohols.

The amount of component (H) blended may be a catalytic amount and properly adjusted depending on the desired cure speed, and is typically 0.1 to 1,000 ppm, preferably 1 to 300 ppm by weight calculated as platinum atom. If the amount is too small, the addition reaction may be substantially retarded, or crosslinking may not take place. If the amount is too large, the cured product is degraded in heat resistance and economy is lost because platinum is expensive.

The platinum base catalyst as component (H) may be used alone or in admixture.

[Other Optional Components]

In obtaining component (A) within the scope of the invention, a reaction inhibitor may be used in addition to the above components (F), (G) and (H). The reaction inhibitor used herein may be selected from prior art well-known reaction inhibitors used in addition curable silicone compositions. Examples include acetylene compounds, typically acetylene alcohols such as 1-ethynyl-1-cyclohexanol and 3,5-dimethyl-1-hexyn-3-ol, nitrogen compounds such as tributylamine, tetramethylethylene diamine, and benzotriazole, organophosphorus compounds such as triphenylphosphine, oxime compounds, and organic chloro-compounds.

The crosslinked silicone gel as component (A) is obtained by heating and mixing components (F) and (G) in the presence of component (H) or platinum base catalyst so that crosslinking, i.e., hydrosilylation reaction (addition reaction) may take place. The reaction temperature is typically about 50 to 180° C., but not limited thereto. Although the reaction time varies depending on the heating temperature, the reaction typically takes place for 0.5 to 12 hours to a full extent. The product obtained by such treatment is defined as "crosslinked" product.

While components (B) to (E) will be described later, the invention may follow a procedure of allowing components (F) and (G) to crosslink in the presence of component (H) to produce component (A) and then mixing components (B) to (E) therewith; another procedure of admitting component (B) to components (F), (G) and (H) prior to heating, heating and mixing components (F) and (G) in the presence of component (H) to produce component (A), and then mixing components (C), (D) and (E) therewith; or a further procedure of admitting all of components (B) to (E) to components (F), (G) and (H) prior to heating, heating and mixing components (F) and (G) in the presence of component (H) to produce component (A). From the aspects of efficiency and safety, a still further procedure of admitting components (B), (C) and (D) to components (F), (G) and (H) prior to heating, heating and mixing components (F) and (G) in the presence of component (H) to produce component (A), cooling, and adding component (E) is preferred.

[Component (B)]

Component (B), which does not participate in crosslinking of components (F) and (G), is a silicone oil containing neither aliphatic unsaturated bonds nor SiH groups and serves as a surface treatment agent for components (C) and (D) to be described later. It is preferably (B-1) a one end trifunctional, hydrolyzable organopolysiloxane having the general formula (1).

[Chem. 3]

(1)

Herein $R^1$ is each independently a $C_1$-$C_6$ alkyl group, $R^2$ is at least one group selected from $C_1$-$C_{18}$ aliphatic unsaturation-free, unsubstituted or substituted monovalent hydrocarbon groups, and "a" is an integer of 5 to 120.

[Component (B-1)]

The organopolysiloxane having formula (1) as component (B-1) is used for the surface treatment of heat conductive fillers as components (C) and (D). It functions to enhance the heat resistance of the heat conductive silicone composition because it helps particles to be heavily packed and covers the surface of particles to prevent particles from agglomerating, and the effect lasts even at high temperature.

In formula (1), $R^1$ is a $C_1$-$C_6$ alkyl group such as methyl, ethyl or propyl, with methyl and ethyl being preferred.

$R^2$ is each independently a $C_1$-$C_{18}$, preferably $C_1$-$C_{14}$ unsubstituted or substituted monovalent hydrocarbon group free of aliphatic unsaturation. Examples thereof include alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; and the foregoing groups in which some or all of the hydrogen atoms are substituted by halogen atoms, e.g., fluorine and chlorine, such as 3,3,3-trifluoropropyl. Of these, alkyl, aryl and 3,3,3-trifluoropropyl groups are preferred, with methyl, phenyl and 3,3,3-trifluoropropyl being more preferred.

The subscript "a" is an integer of 5 to 120, preferably 10 to 90.

Component (B-1) should preferably have a kinematic viscosity at 25° C. of 5 to 500 mm$^2$/s, more preferably 10 to 300 mm$^2$/s.

The silicone oil as component (B-1) may be used alone or in admixture of two or more.

To component (B), (B-2) a non-functional liquid silicone oil free of reactive groups may be added as the silicone oil not participating in crosslinking.
[Component (B-2)]

The non-functional liquid silicone oil as component (B-2) is an organopolysiloxane having a kinematic viscosity at 25° C. of 10 to 500,000 mm²/s, preferably 30 to 10,000 mm²/s. If the kinematic viscosity of organopolysiloxane is below the lower limit, the resulting heat conductive silicone composition is liable to oil bleeding. If the kinematic viscosity exceeds the upper limit, the resulting composition has too high a viscosity to handle.

The non-functional liquid silicone oil as component (B-2) may be selected from prior art well-known organopolysiloxanes as long as it has a kinematic viscosity in the above range. The molecular structure of the organopolysiloxane (or silicone oil) is not particularly limited and may be linear, branched or cyclic. In particular, an organopolysiloxane of linear structure having a backbone consisting of repeating diorganosiloxane units and capped with triorganosiloxy groups at both ends of the molecular chain is preferred.

The non-functional liquid silicone oil may be represented by the average compositional formula (6).

$$R^7_g SiO_{(4-g)/2} \quad (6)$$

In formula (6), $R^7$ is independently a $C_1$-$C_{18}$, preferably $C_1$-$C_{14}$ unsubstituted or substituted monovalent hydrocarbon group free of aliphatic unsaturation. Examples thereof include alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; and the foregoing groups in which some or all of the hydrogen atoms are substituted by halogen atoms, e.g., fluorine and chlorine, such as 3,3,3-trifluoropropyl. Of these, alkyl, aryl and 3,3,3-trifluoropropyl groups are preferred, with methyl, phenyl and 3,3,3-trifluoropropyl being more preferred.

In formula (6), g is a number in the range of 1.8 to 2.2, preferably 1.9 to 2.1. As long as g is in the range, the resulting heat conductive silicone composition has the desired kinematic viscosity.

Of the organopolysiloxanes having formula (6), a linear organopolysiloxane having the formula (7) is preferred.

[Chem. 4]

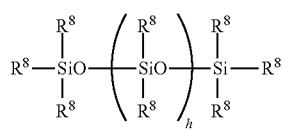

(7)

In formula (7), $R^8$ is each independently a $C_1$-$C_{18}$, preferably $C_1$-$C_{14}$ unsubstituted or substituted monovalent hydrocarbon group free of aliphatic unsaturation. Examples of the monovalent hydrocarbon group are as exemplified above for $R^7$ in formula (6). Most preferably, all groups $R^8$ are methyl. The subscript h is such a number that the organopolysiloxane may have a kinematic viscosity at 25° C. of 10 to 500,000 mm²/s, preferably 30 to 10,000 mm²/s, more preferably 100 to 8,000 mm²/s.

When used, component (B-2) is preferably blended in an amount of 10 to 70% by weight, more preferably 10 to 60% by weight, even more preferably 10 to 50% by weight of component (B). A too large amount of component (B-2) means a relatively reduced amount of component (B-1), resulting in insufficient surface treatment of heat conductive fillers as components (C) and (D). A too small amount of component (B-2) may detract from economy.

The non-functional liquid silicone oil as component (B-2) may be used alone or in admixture of two or more.

The silicone oil as component (B) is preferably blended in an amount of 10 to 90% by weight, more preferably 30 to 80% by weight, even more preferably 50 to 80% by weight based on the total weight of components (A) and (B). If component (B) is less than 10% by weight, the resulting composition may have a high viscosity and be awkward to handle. If component (B) is more than 90% by weight, the resulting composition may be degraded in slide resistance.
[Component (C)]

Component (C) is an aluminum powder for imparting heat conductivity to the silicone composition.

Component (C) is characterized in that it contains (C-1) an aluminum powder having an average particle size of from 40 μm to 100 μm, (C-2) an aluminum powder having an average particle size of from 6 μm to less than 40 μm, and (C-3) an aluminum powder having an average particle size of from 0.4 μm to less than 6 μm, wherein components (C-1), (C-2) and (C-3) are blended in a specific ratio. Preferably, component (C) consists of components (C-1), (C-2) and (C-3).

As used herein, the "average particle size" refers to a particle diameter at 50% accumulation in the volume basis particle size distribution as measured by the laser diffraction/scattering method. For the measurement of the average particle size and particle size distribution of aluminum powder by the laser diffraction/scattering method, for example, a particle size analyzer Microtrac MT3300EX (Nikkiso Co., Ltd.) may be used. The aluminum particles may be of irregular, spherical or any other shape while they may have been previously surface treated. The shape of aluminum particles includes flake, teardrop, spherical, needle, and irregular shapes.

The aluminum powder as component (C) is used in an amount of 800 to 2,000 parts by weight, preferably 900 to 1,800 parts by weight, more preferably 1,000 to 1,600 parts by weight per 100 parts by weight of components (A) and (B) combined. If the amount of aluminum powder as component (C) is below the lower limit, undesirably the composition has a low thermal conductivity. If the amount exceeds the upper limit, undesirably the composition shows a viscosity buildup.

Component (C-1) is an aluminum powder having an average particle size of from 40 μm to 100 μm, preferably from 40 μm to 80 μm. If the average particle size of component (C-1) is less than the lower limit, the silicone composition shows a decline of thermal conductivity. If the average particle size of component (C-1) exceeds the upper limit, the silicone composition loses smoothness and when practically applied to a substrate, comes in poor contact with the substrate to bring a rise of thermal resistance.

The amount of component (C-1) blended is 30 to 70% by weight, preferably 40 to 60% by weight of the total weight of aluminum powder as component (C). If the amount of component (C-1) is less than the lower limit, the silicone composition has a low thermal conductivity. If the amount of component (C-1) exceeds the upper limit, it fails to take the close-packed structure with components (C-2) and (C-3) and so, the heat conductive silicone composition shows a viscosity buildup.

Component (C-2) is an aluminum powder having an average particle size of from 6 μm to less than 40 μm, preferably from 6 μm to 20 μm, more preferably from 6 μm to 12 μm. If the average particle size of component (C-2) is less than the lower limit, it fails to take the close-packed structure with component (C-3) and so, the heat conductive silicone composition shows a viscosity buildup. If the average particle size of component (C-2) exceeds the upper limit, it fails to take the close-packed structure with component (C-1) and so, the heat conductive silicone composition shows a viscosity buildup.

The amount of component (C-2) blended is 10 to 60% by weight, preferably 10 to 40% by weight, more preferably 15 to 35% by weight of the total weight of aluminum powder as component (C). If the amount of component (C-2) is less than the lower limit, it fails to take the close-packed structure with component (C-3) and so, the heat conductive silicone composition shows a viscosity buildup. If the amount of component (C-2) exceeds the upper limit, it fails to take the close-packed structure with component (C-1) and so, the heat conductive silicone composition shows a viscosity buildup.

Component (C-3) is an aluminum powder having an average particle size of from 0.4 μm to less than 6 μm, preferably from 0.4 μm to 3 μm. If the average particle size of component (C-3) is less than the lower limit, undesirably the heat conductive silicone composition shows a viscosity buildup. If the average particle size of component (C-3) exceeds the upper limit, it fails to take the close-packed structure with component (C-2) and so, the heat conductive silicone composition shows a viscosity buildup.

The amount of component (C-3) blended is 10 to 60% by weight, preferably 10 to 40% by weight, more preferably 15 to 35% by weight of the total weight of aluminum powder as component (C). If the amount of component (C-3) is less than the lower limit, it fails to take the close-packed structure and so, the heat conductive silicone composition shows a viscosity buildup. If the amount of component (C-3) exceeds the upper limit, it fails to take the close-packed structure with component (C-2) and so, the heat conductive silicone composition shows a viscosity buildup.

The volume basis accumulative distribution curve of the aluminum powder consisting of components (C-1), (C-2) and (C-3) as measured by the laser diffraction method is not particularly limited in shape. The curve may have three maximum peaks, two maximum peaks or only one maximum peak.

[Component (D)]

Component (D) is a zinc oxide powder having an average particle size of 0.1 to 10 μm, preferably 1 to 4 μm. The shape of zinc oxide particles is not particularly limited and may be, for example, spherical or irregular.

If the average particle size of zinc oxide powder is less than 0.1 μm, the resulting silicone composition has a high viscosity and is awkward to handle. If the average particle size exceeds 10 μm, the resulting silicone composition becomes non-uniform.

The zinc oxide powder as component (D) is used in an amount of 50 to 500 parts by weight, preferably 100 to 400 parts by weight, more preferably 200 to 300 parts by weight per 100 parts by weight of components (A) and (B) combined. This is because the composition has a high viscosity and is awkward to handle when the amount of component (D) is less than 50 parts by weight or more than 500 parts by weight.

In addition to the aluminum powder and zinc oxide powder, the heat conductive silicone composition may contain at least one powder selected from titanium oxide powder, alumina powder, boron nitride powder, aluminum nitride powder, diamond powder, gold powder, silver powder, copper powder, carbon powder, nickel powder, indium powder, gallium powder, metallic silicon powder, and silica powder, in a total amount of up to 200 parts by weight, preferably up to 150 parts by weight per 100 parts by weight of components (A) and (B) combined.

[Component (E)]

Component (E) is a volatile solvent. It may be any of solvents in which components (A) and (B) are dissolvable or dispersible, for example, toluene, xylene, acetone, methyl ethyl ketone, cyclohexanone, n-hexane, n-heptane, butanol, isopropyl alcohol (IPA), and isoparaffin. Of these, isoparaffin base solvents are preferred from the standpoints of safety, hygiene, and printing efficiency.

The volatile solvent as component (E) has a boiling point of 80 to 360° C., preferably 150 to 350° C. If the boiling point is below 80° C., fast volatilization may take place to incur a viscosity buildup in the course of coating operation, which is troublesome. If the boiling point is above 360° C., there is a likelihood that the solvent remains in the heat conductive silicone composition and adversely affects the thermal properties thereof.

The amount of component (E) added is preferably in the range of 10 to 300 parts by weight, more preferably 20 to 200 parts by weight, even more preferably 20 to 100 parts by weight per 100 parts by weight of components (A) and (B) combined. The reason is that if the amount of component (E) is less than 10 parts by weight, the viscosity at room temperature of the heat conductive silicone composition cannot be fully reduced, which adversely affects the workability during printing, and that if the amount of component (E) exceeds 300 parts by weight, the fillers settle down so fast that the heat conductive silicone composition may lose storage stability.

Prior to the addition of component (E), the heat conductive silicone composition of the invention should preferably have a viscosity in the range of 300 to 2,000 Pa·s, more preferably 400 to 1,500 Pa·s, even more preferably 500 to 1,000 Pa·s. This is because a viscosity below 300 Pa·s may lead to poor slide resistance. If the viscosity exceeds 2,000 Pa·s, the composition is too hard with a possibility to break semiconductor chips.

After the addition of component (E), the silicone composition should preferably have a viscosity in the range of 10 to 300 Pa·s, more preferably 30 to 250 Pa·s, even more preferably 30 to 200 Pa·s. This is because a viscosity below 10 Pa·s allows heat conductive fillers to settle down whereas a viscosity above 300 Pa·s hinders handling. As used herein, the viscosity is measured at 25° C. by a rotational viscometer (the same holds true, hereinafter).

The method of preparing the heat conductive silicone composition of the invention is not particularly limited. The composition may be obtained by mixing components (A) to (E), and optionally adding other components. The mixing machine is not particularly limited and a mixer such as planetary mixer, Trimix or Twin Mix may be used. With respect to the order of mixing of components (A) to (E), as mentioned above, component (A) may be prepared before components (B) to (E) are mixed therewith; the raw materials (i.e., components (F). (G) and (H)) for component (A) may be mixed with components (B) to (E) and heated to produce component (A); or a mixture of components (A) to (D) may be mixed with component (E).

In the practice of the invention, the heat conductive silicone composition is applied as by screen printing and allowed to stand at room temperature for a certain time. As the volatile solvent volatilizes off, the heat conductive silicone composition builds up its viscosity and exerts satisfactory slide resistance performance.

When the heat conductive silicone composition is thinly coated to a heat sink or the like by printing means such as a metal screen, the solvent volatilizes at normal temperature or is readily volatilized by positive heating. This high performance silicone composition is ready for practical application although prior art heat conductive silicone compositions are difficult to coat uniformly and thinly.

The heat conductive silicone composition is advantageously used in such applications as the heat dissipation of heat-generating devices such as CPUs and GPUs in laptop computers and heat-generating devices in electronic control units (ECUs) mounted on vehicles.

EXAMPLES

Examples and Comparative Examples are given below for further illustrating the invention although the invention is not limited thereto. Notably, the kinematic viscosity is measured at 25° C. by an Ostwald viscometer. To demonstrate the superiority of the invention, tests were carried out in Examples and Comparative Examples as follows.

[Measurement of Average Particle Size]

The average particle size of components (C) and (D) is a volume basis accumulative average diameter as measured by the laser diffraction/scattering method using a particle size analyzer Microtrac MT3300EX (Nikkiso Co., Ltd.).

[Thermal Conductivity]

The thermal conductivity of a heat conductive silicone composition, before and after the addition of component (E), was measured at 25° C. by the hot disk method according to ISO 22007-2, using meter TPS-2500S (Kyoto Electronics Mfg. Co., Ltd.).

[Viscosity of Heat Conductive Silicone Composition]

The viscosity of a heat conductive silicone composition, before and after the addition of component (E), was measured at 25° C. by a rotational viscometer, specifically at 25° C. by Malcom viscometer Type PC-10AA (Malcom Co., Ltd.).

[Printing Efficiency]

A stainless steel (SUS) plate of 3 cm squares and 120 μm thick was cut out as a metal screen. Using the metal screen and a squeegee, a heat conductive silicone composition (grease) was coated onto a heat sink.

(Evaluation results)
○: uniform coating on overall surface
Δ: some irregularities on grease surface
x: cannot be coated because squeegee is wrapped with grease

[Sliding Test]

A heat conductive silicone composition was sandwiched between two glass plates with a spacer of 0.3 mm thick so as to form a disc-shaped sample of diameter 1.5 cm. The test assembly was set on a thermal impact tester Model TSE-11-A (Espec Corp.) such that the assembly was inclined 90° relative to the ground, and tested over 500 cycles between −40° C./30 min. and 125° C./30 min. After 500 cycles, the distance over which the heat conductive silicone composition was slid or shifted from the original position was measured.

<Judgment>

A slide distance within 1 mm is rated as good slide resistance.

[Appearance after Sliding Test]

The state of the heat conductive silicone composition after 500 cycles of the sliding test was observed. The composition is rated good (○) for no voids or crazing and poor (x) for voids or crazing.

Examples 1 to 4 and Comparative Examples 1 to 8

A heat conductive silicone composition was prepared by charging a planetary mixer with components as shown in Tables 1 to 3 and conducting the following steps.

Namely, components (B), (C), (D), and (F) were admitted into the planetary mixer and mixed at room temperature for 10 minutes. Then components (G) and (H) were admitted to the mixer which was heated at a temperature of 170° C., after which heating and mixing was continued for 2 hours to effect hydrosilylation reaction of components (F) and (G) to produce a crosslinked silicone gel as component (A). After the mixture was cooled below 40° C., component (E) was added thereto to complete the composition. The above tests were carried out on the resulting composition. The results are also shown in Tables 1 to 3.

[Component (B)]
(B-1-1)

[Chem. 5]

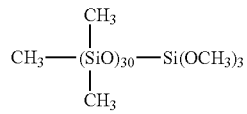

kinematic viscosity 35 mm²/s
(B-2-1)
linear dimethylpolysiloxane capped with trimethylsilyl groups at both ends, 1,000 mm²/s

[Component (C)]
(C-1-1) aluminum powder (average particle size: 61 μm)
(C-1-2) aluminum powder (average particle size: 46 μm)
(C-2-1) aluminum powder (average particle size: 10 μm)
(C-3-1) aluminum powder (average particle size: 1.1 μm)
(C-4-1) aluminum powder (average particle size: 0.2 μm)<for comparison>

[Component (D)]
(D-1) zinc oxide powder (average particle size: 1.0 μm)

[Component (E)]
(E-1) IP Solvent 2028 (trade name of isoparaffin base solvent, Idemitsu Kosan Co., Ltd., boiling point 210-254° C.)

[Component (F)]
(F-1)
  linear dimethylpolysiloxane capped with vinyl groups at both ends, having a kinematic viscosity of 600 mm²/s
(F-2)
  linear dimethylpolysiloxane capped with vinyl groups at both ends, having a kinematic viscosity of 30,000 mm²/s

[Component (G)]
(G-1)

[Chem. 6]

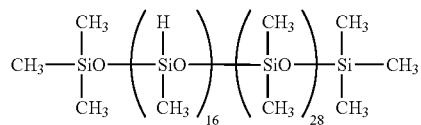

α/β=0.35, kinematic viscosity 113 mm²/s
(G-2)

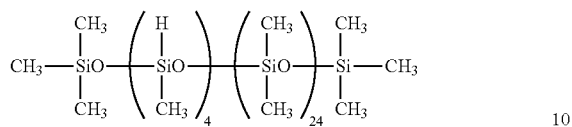

α/β=0.13, kinematic viscosity 25 mm²/s
[Component (H)]
(H-1)
  solution of platinum-divinyltetramethyldisiloxane complex in the same dimethylpolysiloxane as (F-1) (Pt content: 1 wt %)

TABLE 1

| Amount of components (pbw) | | | Example 1 | Example 2 | Example 3 | Example 4 |
|---|---|---|---|---|---|---|
| Component (A) | Component (F) | (F-1) | 20.57 | 20.57 | 30 | 20.57 |
| | | (F-2) | | | 7.7 | |
| | Component (G) | (G-1) | 0.43 | 0.34 | | 0.43 |
| | | (G-2) | | | 2.3 | |
| | Component (H) | (H-1) | 0.18 | 0.17 | 0.17 | 0.18 |
| Component (B) | | (B-1-1) | 79 | 79 | 60 | 50 |
| | | (B-2-1) | | | | 29 |
| Component (C) | | (C-1-1) | 850 <57.0%> | | | 850 <57%> |
| | | (C-1-2) | | 500 <40%> | 500 <40%> | |
| | | (C-2-1) | 350 <23.5%> | 420 <33.6%> | 420 <33.6%> | 350 <23.5%> |
| | | (C-3-1) | 290 <19.5%> | 330 <26.4%> | 330 <26.4%> | 290 <19.5%> |
| Component (D) | | (D-1) | 290 | 250 | 250 | 290 |
| Component (E) | | (E-1) | 38 | 32 | 32 | 56 |
| H/Vi* | | | 0.68 | 0.55 | 0.90 | 0.68 |
| Test results | | | | | | |
| Thermal conductivity before addition of component (E) (W/mK) | | | 11.0 | 7.6 | 7.5 | 10.9 |
| Thermal conductivity after addition of component (E) (W/mK) | | | 5.6 | 4.7 | 4.6 | 4.8 |
| Viscosity before addition of component (E) (Pa·s) | | | 890 | 450 | 620 | 990 |
| Viscosity after addition of component (E) (Pa·s) | | | 110 | 40 | 52 | 70 |
| Printing efficiency | | | ○ | ○ | ○ | ○ |
| Slide distance (mm) | | | 0 | 0 | 0 | 0 |
| Appearance after sliding test | | | ○ | ○ | ○ | ○ |

The figure within < > in the row of component (C) designates a proportion wt % in component (C) (the same holds true, hereinafter).
*H/Vi designates the number of silicon-bonded hydrogen atoms in component (G) per silicon-bonded alkenyl group in component (F) for the sake of convenience (the same holds true, hereinafter).

TABLE 2

| Amount of components (pbw) | | | Comparative Example 1 | 2 | 3 | 4 | 5 |
|---|---|---|---|---|---|---|---|
| Component (A) | Component (F) | (F-1) | 20.57 | 20.57 | 20.57 | 20.57 | 20.57 |
| | | (F-2) | | | | | |
| | Component (G) | (G-1) | 0.43 | 0.43 | 0.43 | 0.43 | 0.43 |
| | | (G-2) | | | | | |
| | Component (H) | (H-1) | 0.18 | 0.18 | 0.18 | 0.18 | 0.18 |
| Component (B) | | (B-1-1) | 79 | 79 | 79 | 79 | 79 |
| | | (B-2-1) | | | | | |

TABLE 2-continued

|  |  | Comparative Example | | | | |
|---|---|---|---|---|---|---|
| Amount of components (pbw) |  | 1 | 2 | 3 | 4 | 5 |
| Component (C) | (C-1-1) | 850 <57.0%> | 1,120 <75.2%> | 200 <13.4%> | 970 <65.1%> | 250 <16.8%> |
|  | (C-1-2) |  |  |  |  |  |
|  | (C-2-1) | 350 <23.5%> | 300 <20.1%> | 500 <33.6%> | 70 <4.7%> | 790 <53.0%> |
|  | (C-3-1) |  | 70 <4.7%> | 790 <53.0%> | 450 <30.2%> | 450 <30.2%> |
|  | (C-4-1) <for comparison> | 290 <19.5%> |  |  |  |  |
| Component (D) | (D-1) | 290 | 290 | 290 | 290 | 290 |
| Component (E) | (E-1) | 38 | 38 | 38 | 38 | 38 |
| H/Vi* |  | 0.68 | 0.68 | 0.68 | 0.68 | 0.68 |
|  |  | Test results | | | | |
| Thermal conductivity before addition of component (E) (W/mK) |  | — | — | — | — | — |
| Thermal conductivity after addition of component (E) (W/mK) |  | — | — | — | — | — |
| Viscosity before addition of component (E) (Pa · s) |  | not becoming pasty | not becoming pasty | not becoming pasty | not becoming pasty | not becoming pasty |
| Viscosity after addition of component (E) (Pa · s) |  | — | — | — | — | — |
| Printing efficiency |  | — | — | — | — | — |
| Slide distance (mm) |  | — | — | — | — | — |
| Appearance after sliding test |  | — | — | — | — | — |

TABLE 3

|  |  |  | Comparative Example | | |
|---|---|---|---|---|---|
| Amount of components (pbw) |  |  | 6 | 7 | 8 |
| Component (A) | Component (F) | (F-1) | 20.57 | 20.57 | 20.57 |
|  |  | (F-2) |  |  |  |
|  | Component (G) | (G-1) | 0.43 | 0.43 | 0.43 |
|  |  | (G-2) |  |  |  |
|  | Component (H) | (H-1) | 0.18 | 0.18 | 0.18 |
| Component (B) |  | (B-1-1) | 79 | 79 | 79 |
|  |  | (B-2-1) |  |  |  |
| Component (C) |  | (C-1-1) | 850 <57.0%> | 850 <57.0%> | 850 <57.0%> |
|  |  | (C-1-2) |  |  |  |
|  |  | (C-2-1) | 350 <23.5%> | 350 <23.5%> | 350 <23.5%> |
|  |  | (C-3-1) | 290 <19.5%> | 290 <19.5%> | 290 <19.5%> |
|  |  | (C-4-1) <for comparison> |  |  |  |
| Component (D) |  | (D-1) | 290 | 700 | 10 |
| Component (E) |  | (E-1) | 38 | 38 |  |
|  | H/Vi* |  | 0.68 | 0.68 | 0.68 |
| Test results | | | | | |
| Thermal conductivity before addition of component (E) (W/mK) | | | 11.0 | — | — |
| Thermal conductivity after addition of component (E) (W/mK) | | | — | — | — |
| Viscosity before addition of component (E) (Pa·s) | | | 890 | not becoming pasty | not becoming pasty |
| Viscosity after addition of component (E) (Pa·s) | | | — | — | — |
| Printing efficiency | | | × | — | — |
| Slide distance (mm) | | | 0 | — | — |
| Appearance after sliding test | | | ○ | — | — |

The invention claimed is:

1. A heat conductive silicone composition comprising
(A) a crosslinked silicone gel,
(B) a silicone oil containing neither aliphatic unsaturated bonds nor SiH groups and serving as a surface treatment agent for components (C) and (D),
(C) an aluminum powder in an amount of 800 to 2,000 parts by weight per 100 parts by weight of components (A) and (B) combined, the aluminum powder including
(C-1) an aluminum powder having an average particle size of from 40 μm to 100 μm in an amount of 30 to 70% by weight of component (C), (C-2) an aluminum powder having an average particle size of from 6 μm to less than 40 μm in an amount of 10 to 60% by weight of component (C), and (C-3) an aluminum powder having an average particle size of from 0.4 um to less than 6 um in an amount of 10 to 60% by weight of component (C), (D) a zinc oxide powder having an average particle size of 0.1 to 10 μm in an amount of 50 to 500 parts by weight per 100 parts by weight of components (A) and (B) combined, and (E) a volatile solvent in an amount of 10 to 300 parts by weight per 100 parts by weight of components (A) and (B) combined.

2. The heat conductive silicone composition of claim 1 wherein component (B) contains (B-1) a silicone oil in the form of a one end hydrolyzable organopolysiloxane having the general formula (1):

[Chem. 1]

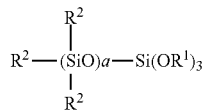

(1)

wherein $R^1$ is each independently a $C_1$-$C_6$ alkyl group, $R^2$ is at least one group selected from $C_1$-$C_{18}$ aliphatic unsaturation-free, unsubstituted or substituted monovalent hydrocarbon groups, and a is an integer of 5 to 120, and component (B) is blended in an amount of 10 to 90% by weight based on the total weight of components (A) and (B).

3. The heat conductive silicone composition of claim 1 wherein component (A) contains a crosslinked silicone gel composed of:

(F) an organopolysiloxane containing at least one silicon-bonded alkenyl group per molecule, represented by the average compositional formula (2):

(2)

wherein $R^3$ is an alkenyl group, $R^4$ is an aliphatic unsaturation-free, unsubstituted or substituted monovalent hydrocarbon group, b is a number of 0.0001 to 0.2, c is a number of 1.7 to 2.2, and b+c is a number of 1.9 to 2.4, and (G) an organohydrogenpolysiloxane containing at least 4 silicon-bonded hydrogen atoms at non-terminal positions of the molecular chain per molecule, and meeting the formula (3):

$$0.1 < \alpha/\beta \qquad (3)$$

wherein $\alpha$ is the number of silicon-bonded hydrogen atoms at non-terminal positions of the molecular chain and $\beta$ is the total number of silicon atoms in component (G).

4. The heat conductive silicone composition of claim 1 wherein component (B) further contains (B-2) a non-functional liquid silicone oil having a kinematic viscosity of 10 to 500,000 mm²/s at 25° C., in an amount of 10 to 70% by weight of component (B).

5. The heat conductive silicone composition of claim 1 wherein component (E) is an isoparaffin base solvent having a boiling point of 80 to 360° C.

6. A method of preparing a heat conductive silicone composition comprising the step of mixing the following:

(A) a crosslinked silicone gel, (B) a silicone oil containing neither aliphatic unsaturated bonds nor SiH groups and serving as a surface treatment agent for components (C) and (D), (C) an aluminum powder in an amount of 800 to 2,000 parts by weight per 100 parts by weight of components (A) and (B) combined, the aluminum powder including (C-1) an aluminum powder having an average particle size of from 40 μm to 100 μm in an amount of 30 to 70% by weight of component (C), (C-2) an aluminum powder having an average particle size of from 6 μm to less than 40 μm in an amount of 10 to 60% by weight of component (C), and (C-3) an aluminum powder having an average particle size of from 0.4 μm to less than 6 μm in an amount of 10 to 60% by weight of component (C), (D) a zinc oxide powder having an average particle size of 0.1 to 10 μm in an amount of 50 to 500 parts by weight per 100 parts by weight of components (A) and (B) combined, and (E) a volatile solvent in an amount of 10 to 300 parts by weight per 100 parts by weight of components (A) and (B) combined.

* * * * *